US012207553B2

United States Patent
Lim et al.

(10) Patent No.: US 12,207,553 B2
(45) Date of Patent: Jan. 21, 2025

(54) ALIGNED ORGANIC-INORGANIC COMPOSITE THERMOELECTRIC MATERIAL AND MANUFACTURING METHOD THEREOF

(71) Applicant: GACHON UNIVERSITY INDUSTRY ACADEMIC COOPERATION FOUNDATION, Seongnam-si (KR)

(72) Inventors: Jae-Hong Lim, Seongnam-si (KR); Young Soo Yoon, Gwacheon-si (KR); Kang Yeol Lee, Gwacheon-si (KR)

(73) Assignee: GACHON UNIVERSITY INDUSTRY ACADEMIC COOPERATION FOUNDATION, Seongnam-si (KR)

( * ) Notice: Subject to any disclaimer, the term of this patent is extended or adjusted under 35 U.S.C. 154(b) by 150 days.

(21) Appl. No.: 17/773,811

(22) PCT Filed: Oct. 14, 2020

(86) PCT No.: PCT/KR2020/013986
§ 371 (c)(1),
(2) Date: May 2, 2022

(87) PCT Pub. No.: WO2021/091110
PCT Pub. Date: May 14, 2021

(65) Prior Publication Data
US 2022/0384700 A1 Dec. 1, 2022

(30) Foreign Application Priority Data
Nov. 4, 2019 (KR) .......... 10-2019-0139470

(51) Int. Cl.
*H01B 1/00* (2006.01)
*H01B 1/12* (2006.01)
(Continued)

(52) U.S. Cl.
CPC .......... *H10N 10/852* (2023.02); *H01B 1/124* (2013.01); *H10N 10/01* (2023.02); *H10N 10/853* (2023.02); *H10N 10/856* (2023.02)

(58) Field of Classification Search
CPC .......... H01B 1/00; H01B 1/124; H01B 1/125; H01B 1/127; H01B 1/128; H01B 1/20;
(Continued)

(56) References Cited

U.S. PATENT DOCUMENTS

| 9,793,446 | B2 * | 10/2017 | Kurtin | ......... | H01L 33/502 |
| 2011/0129668 | A1 * | 6/2011 | Zyung | ......... | B82Y 30/00 |
| | | | | | 428/401 |
| 2017/0110643 | A1 * | 4/2017 | Choa | ......... | H10N 10/852 |

FOREIGN PATENT DOCUMENTS

| JP | 2015228498 A | 12/2015 |
| KR | 20110061751 A | 6/2011 |

(Continued)

OTHER PUBLICATIONS

Dutta et al "Optical and electrical characterizations of self-assembled CdS nanorods-polyaniline composites", J. Appl. Phys. 101, 093711 (2007).*

(Continued)

*Primary Examiner* — Mark Kopec
(74) *Attorney, Agent, or Firm* — STIP Law Group, LLC

(57) ABSTRACT

Proposed are an organic-inorganic composite thermoelectric material and a preparation method thereof. The organic-inorganic composite thermoelectric material includes an organic matrix and an inorganic thermoelectric portion dispersed in the organic matrix and including a nanomaterial. The organic matrix includes an organic conductor, and the nanomaterial includes at least one selected from the group consisting of a chalcogen element and a chalcogenide. The organic-inorganic composite thermoelectric material of the present invention has advantages of low cost and excellent (Continued)

A PLURALITY OF ALIGNED Te NANOWIRES BEFORE PEDOT:PSS IS SPIN-COATED IN EXAMPLE 2 thermoelectric properties through complexation of an aligned inorganic thermoelectric material and an organic thermoelectric material.

5 Claims, 4 Drawing Sheets

(51) Int. Cl.
*H10N 10/01* (2023.01)
*H10N 10/852* (2023.01)
*H10N 10/853* (2023.01)
*H10N 10/856* (2023.01)

(58) Field of Classification Search
CPC .. H10N 10/851; H10N 10/852; H10N 10/853; C01B 19/002; C01B 19/007; C01B 19/04
See application file for complete search history.

(56) References Cited

FOREIGN PATENT DOCUMENTS

| KR | 20140016475 A | 2/2014 |
| KR | 20150142984 A | 12/2015 |
| WO | WO2006133031 A2 | 12/2006 |

OTHER PUBLICATIONS

Wang et al "Flexible low-grade energy utilization devices based on high-performance thermoelectric polyaniline/ tellurium nanorod hybrid films", J. Mater. Chem. A, 2016, 4, 3554.*
International Search Report of PCT/KR2020/013986, Oct. 14, 2020, English translation.

* cited by examiner

A PLURALITY OF ALIGNED Se NANOWIRES BEFORE
PEDOT:PSS IS SPIN-COATED IN EXAMPLE 1

A PLURALITY OF ALIGNED Te NANOWIRES BEFORE
PEDOT:PSS IS SPIN-COATED IN EXAMPLE 2

ALIGNED ORGANIC-INORGANIC COMPOSITE THERMOELECTRIC MATERIAL AND MANUFACTURING METHOD THEREOF

CROSS-REFERENCE TO RELATED APPLICATIONS

This application is the U.S. National Phase under 35 U.S.C. § 371 of International Application No. PCT/KR2020/013986 filed on Oct. 14, 2020, which in turn claims the benefit of Korean Application No. 10-2019-0139470, filed on Nov. 4, 2019, the disclosures of which are incorporated by reference into the present application.

TECHNICAL FIELD

The present invention relates to an organic-inorganic composite thermoelectric material and a manufacturing method thereof and, more particularly, to an aligned organic-inorganic composite thermoelectric material and a manufacturing method thereof.

BACKGROUND ART

In general, thermoelectric materials are a generic term for materials exhibiting a thermoelectric effect that enables direct conversion between thermal energy to electrical energy and are thus attracting attention as next-generation eco-friendly energy materials that can solve the recently emerging problems of energy depletion and environmental pollution.

The principles of thermoelectricity driving are separated into the Seebeck effect in which an electromotive force is generated inside a conductor due to a temperature difference with the external temperature and the Peltier effect, in which a temperature difference occurs between different conductors due to an externally applied current. The effects are expected be directly applied to thermoelectric power generation or cooling devices, etc. without intervention of the existing moving parts or accessories such as bulk fluids for cooling. Accordingly, various studies have been conducted for several decades on development of a thermoelectric material exhibiting high thermoelectric conversion efficiency and a thermoelectric device including the same.

In order for materials to have high thermoelectric conversion efficiency, the materials must have a low thermal conductivity while showing an excellent Seebeck coefficient and high electrical conductivity in terms of a dimensionless thermoelectric figure of merit (ZT).

Although inorganic semiconductor materials are advantageous in terms of showing a relatively high thermoelectric performance index, the materials have problems in that the materials require high processing temperature, long processing time, and high cost, and the materials are difficult to be processed into suitable forms for thermoelectric device modules having various sizes and shapes.

Recently, active studies are conducted on the use of organic materials as thermoelectric materials. Compared to inorganic materials, organic thermoelectric materials have relatively simple processing conditions, are economical, and can be easily molded to a size and shape suitable for a device module. However, there is a problem in that organic materials have a significantly low thermoelectric performance index because organic materials have a relatively low Seebeck constant compared to inorganic semiconductors.

In addition, although a hybrid composite form composed of a conductive polymer and an inorganic material was developed, there was a problem in that the properties of the thermoelectric material were not good because the inorganic material was not well aligned.

DISCLOSURE

Technical Problem

The objective of the present invention is to provide an organic-inorganic composite thermoelectric material that is inexpensive and has excellent thermoelectric properties because an aligned inorganic thermoelectric material and an organic thermoelectric material are combined.

Technical Solution

According to one aspect of the present invention, there is provided an organic-inorganic composite thermoelectric material including an organic matrix comprising an organic conductor; and an inorganic thermoelectric portion dispersed in the organic matrix and comprising a nanomaterial having at least one selected from the group consisting of a chalcogen element and a chalcogenide, in which the nanomaterial is an aligned material.

In addition, the nanomaterials may be spaced apart from each other and aligned in parallel.

In addition, the nanomaterial may have at least one shape selected from the group consisting of a nanorod, a nanowire, a nanotrunk, and a nanoplate-like structure.

In addition, the chalcogen element may include at least one selected from the group consisting of sulfur (S), selenium (Se), tellurium (Te), and polonium (Po).

In addition, the chalcogenide may be a compound containing a chalcogen element.

In addition, the chalcogenide may include at least one selected from the group consisting of $Ag_2Te$, $CdS$, $PbTeSe$, $Bi_2Se_3$, $Sb_2Se_3$, $PbSe$, $CdSe$, $ZnSe$, $La_3Se_4$, $Ag_xSb_{1-x}Se_2$ (x is a real number less than 1), $AgPb_{18}BiSe_{20}$, $(GeSe)_x(AgSbSe_2)_{1-x}$ (x is a real number less than 1), $Ag_xPb_{18}SbSe_{20}$ (x is a real number less than 1), $Ag_xPb_{22.5}SbSe_{20}$ (x is a real number less than 1), $Sb_xSe_{20}$ (x is a real number less than 1), $Sn_xSe_{1-x}$ (x is a real number less than 1), $Ge_xSe_{1-x}$ (x is a real number less than 1), $Ge_xSb_{1-x}Se$ (x is a real number less than 1), $Bi_2Te_3$, $Sb_2Te_3$, $PbTe$, $CdTe$, $ZnTe$, $La_3Te_4$, $Ag_xSb_{1-x}Te_2$ (x is a real number less than 1), $AgPb_{18}BiTe_{20}$, $(GeTe)_x(AgSbTe_2)_{1-x}$ (x is a real number less than 1), $Ag_xPb_{18}SbTe_{20}$ (x is a real number less than 1), $Ag_xPb_{22.5}SbTe_{20}$ (x is fa real number less than 1), $Sb_xTe_{20}$ (x is a real number less than 1), $Bi_xSb_{2-x}Te_3$ (x is a real number less than 2), $Sn_xTe_{1-x}$ (x is a real number less than 1), $Ge_xTe_{1-x}$ (x is a real number less than 1), and $Ge_xSb_{1-x}Te$ (x is a real number less than 1).

In addition, the organic conductor may include at least one selected from the group consisting of poly(3,4-ethylene dioxythiophene):polystyrene sulfonate (PEDOT:PSS), polyacetylene, polypyrrole, polythiophene, and polyaniline.

According to another aspect of the present invention, there is provided a method of preparing an organic-inorganic composite thermoelectric material, the method including: (a) forming an inorganic thermoelectric portion comprising a nanomaterial having at least one selected from the group consisting of a chalcogen element and a chalcogenide on a substrate; and (b) forming an organic conductor between the nanomaterials to form an organic matrix including the organic conductor, in which the nanomaterials are aligned.

In addition, the method organic-inorganic composite thermoelectric material preparation method may further include (c) of removing the substrate from the organic matrix, step (c) being performed step (b).

In addition, step (a) may include the steps of: (a-1) preparing a precursor aqueous solution containing a precursor; and (a-2) supporting and reacting the support in the precursor aqueous solution so that an inorganic thermoelectric portion including a nanomaterial is formed on the substrate, in which the precursor includes at least one selected from a chalcogen element precursor and a chalcogenide precursor, and the nanomaterial includes at least one selected from the group consisting of a chalcogen element and a chalcogenide.

In addition, the nanomaterials may be spaced apart from each other and aligned in parallel with a primary surface of the substrate.

In addition, the nanomaterial may have at least one shape selected from the group consisting of a nanorod, a nanowire, a nanotrunk, and a nanoplate-like structure.

In addition, the chalcogen element precursor may include at least one selected from the group consisting of selenium dioxide ($SeO_2$), tellurium dioxide ($TeO_2$), sulfur dioxide ($SO_2$), and polonium dioxide ($PoO_2$).

In addition, the chalcogen element precursor may include selenium dioxide ($SeO_2$), and step (a-2) may be performed at a temperature in the range of 10° C. to 100° C.

In addition, the chalcogen element precursor may include tellurium dioxide ($TeO_2$), and step (a-2) may be performed at a temperature in the range of 5° C. to 100° C.

In addition, after step (a-2), step (a) may further include step (a-3) of subjecting the nanomaterial to a topotatic reaction to form the inorganic thermoelectric portion including the nanomaterial on the substrate.

In addition, the precursor aqueous solution may further include hydrofluoric acid (HF).

In addition, the substrate may include any one selected from the group consisting of a ceramic substrate, a metal substrate, and a polymer substrate.

Advantageous Effects

The organic-inorganic composite thermoelectric material of the present invention has advantages of low cost and excellent thermoelectric properties due to the composite of an aligned inorganic thermoelectric material and an organic thermoelectric material.

BEST MODE

Herein after, examples of the present invention will be described in detail with reference to the accompanying drawings in such a manner that the ordinarily skilled in the art can easily implement the present invention.

The description given below is not intended to limit the present invention to specific embodiments. In relation to describing the present invention, when the detailed description of the relevant known technology is determined to unnecessarily obscure the gist of the present invention, the detailed description may be omitted.

The terminology used herein is for the purpose of describing particular embodiments only and is not intended to limit the scope of the present invention. As used herein, the singular forms "a", "an", and "the" are intended to include the plural forms as well unless the context clearly indicates otherwise. It will be further understood that the terms "comprise" or "have" when used in this specification specify the presence of stated features, integers, steps, operations, elements and/or combinations thereof, but do not preclude the presence or addition of one or more other features, integers, steps, operations, elements, and/or combinations thereof.

Figure 1:
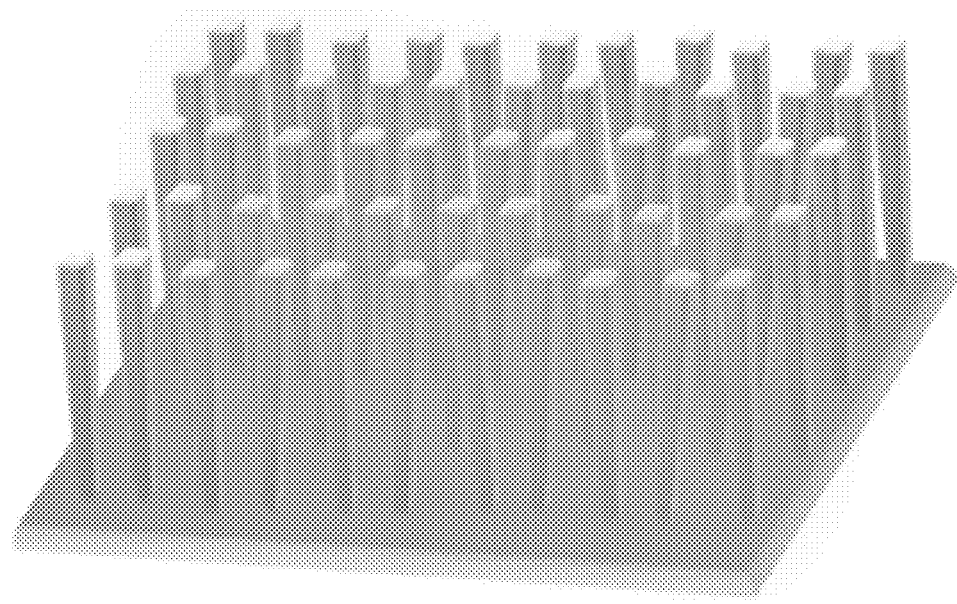
FIG. 1 is a schematic view illustrating an organic-inorganic composite thermoelectric material from which a silicon wafer is not yet removed in Examples 1 and 2.

FIG. 1 is a schematic view illustrating an organic-inorganic composite thermoelectric material from which a silicon wafer is not yet removed, according to examples of the present invention.

Hereinafter, an organic-inorganic composite thermoelectric material of the present invention will be described with reference to FIG. 1.

The present invention provides an organic-inorganic composite thermoelectric material including: an organic matrix comprising an organic conductor; and an inorganic thermoelectric portion dispersed in the organic matrix and comprising a nanomaterial having at least one selected from the group consisting of a chalcogen element and a chalcogenide, in which the nanomaterial is aligned.

Organic Matrix

The organic-inorganic composite thermoelectric material of the present invention may include an organic matrix, and the organic matrix may include an organic conductor.

The organic conductor may include at least one selected from the group consisting of poly(3,4-ethylene dioxythiophene):polystyrene sulfonate (PEDOT:PSS), polyacetylene, polypyrrole, polythiophene, and polyaniline. Preferably, the organic conductor includes PEDOT:PSS.

Inorganic Thermoelectric Portion

The organic-inorganic composite thermoelectric material of the present invention includes an inorganic thermoelectric portion, and the inorganic thermoelectric portion is dispersed in the organic matrix and includes a nanomaterial having at least one selected from the group consisting of a chalcogen element and a chalcogenide.

The nanomaterials may be spaced apart from each other and aligned in parallel.

The nanomaterial may have at least one shape selected from the group consisting of a nanorod, a nanowire, a nanotrunk, and a nanoplate-like structure.

The chalcogen element may include at least one selected from the group consisting of sulfur (S), selenium (Se), tellurium (Te), and polonium (Po). Preferably, the chalcogen element includes at least one selected from the group consisting of tellurium (Te) and selenium (Se).

The chalcogenide may be a compound containing a chalcogen element.

The chalcogenide may include at least one selected from the group consisting of $Ag_2Te$, CdS, PbTeSe, $Bi_2Se_3$, $Sb_2Se_3$, PbSe, CdSe, ZnSe, $La_3Se_4$, $Ag_xSb_{1-x}Se_2$ (x is a real number less than 1), $AgPb_{18}BiSe_{20}$, $(GeSe)_x(AgSbSe_2)_{1-x}$ (x is a real number less than 1), $Ag_xPb_{22.5}SbSe_{20}$ (x is a real number less than 1), $Ag_xPb_{22.5}SbSe_{20}$ (x is a real number less than 1), $Sb_xSe_{20}$ (x is a real number less than 1), $Sn_xSe_{1-x}$ (x is a real number less than 1), $Ge_xSe_{1-x}$ (x is a real number less than 1), $Ge_xSb_{1-x}Se$ (x is a real number less than 1), $Bi_2Te_3$, $Sb_2Te_3$, PbTe, CdTe, ZnTe, $La_3Te_4$, $Ag_xSb_{1-x}Te_2$ (x is a real number less than 1), $AgPb_{18}BiTe_{20}$, $(GeTe)_x(AgSbTe_2)_{1-x}$ (x is a real number less than 1), $Ag_xPb_{18}SbTe_{20}$ (x is a real number less than 1), $Ag_xPb_{22.5}SbTe_{20}$ (x is a real number less than 1), $Sb_xTe_{20}$ (x is a real number less than 1), $Bi_xSb_{2-x}Te_3$ (x is a real number less than 2), $Sn_xTe_{1-x}$ (x is a real number less than 1), $Ge_xTe_{1-x}$ (x is a real number less than 1), and $Ge_xSb_{1-x}Te$ (x is a real number less than 1). Preferably, the chalcogenide may include $Ag_2Te$.

Figure 2:
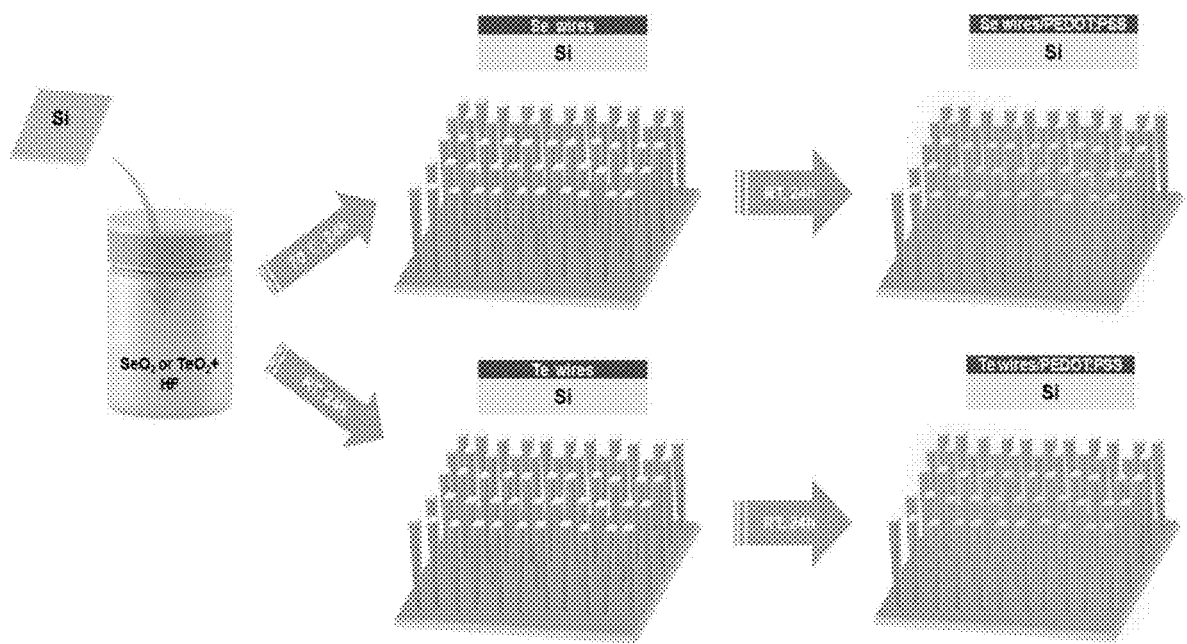
FIG. 2 is a schematic diagram illustrating a method of preparing an organic-inorganic composite thermoelectric material of the present invention.

FIG. 2 is a schematic diagram illustrating a method of preparing an organic-inorganic composite thermoelectric material of the present invention.

Hereinafter, a method of preparing an organic-inorganic composite thermoelectric material, according to the present invention, will be described with reference to FIG. 2.

First, an inorganic thermoelectric portion including a nanomaterial having at least one selected from the group consisting of a chalcogen element and a chalcogenide is formed on a substrate (step a).

Step (a) includes steps of (a-1) of preparing a precursor aqueous solution containing a precursor; and (a-2) supporting and reacting the substrate in the precursor aqueous solution to form an inorganic thermoelectric portion including a nanomaterial on the substrate.

The precursor may include at least one selected from the group consisting of a chalcogen element precursor and a chalcogenide precursor, and the nanomaterial may include at least one selected from the group consisting of a chalcogen element and a chalcogenide.

The nanomaterials may be spaced apart from each other and aligned in parallel with a primary surface of the substrate.

The nanomaterial may have at least one shape selected from the group consisting of a nanorod, a nanowire, a nanotrunk, and a nanoplate-like structure.

The chalcogen element precursor may include at least one selected from the group consisting of selenium dioxide ($SeO_2$), tellurium dioxide ($TeO_2$), sulfur dioxide ($SO_2$), and polonium dioxide ($PoO_2$).

The chalcogen element precursor may include selenium dioxide ($SeO_2$), and step (a-2) may be performed at a temperature in the range of 10° C. to 100° C. and preferably at a temperature in the range of 60° C. to 80° C. When the temperature is lower than 10° C., the chemical reaction rate is excessively low and the crystallinity of the nanomaterial made of chalcogen element or chalcogenide which is the reaction product is not good. When the temperature exceeds 100° C., it is not preferable due to evaporation of the precursor aqueous solution.

The chalcogen element precursor may include selenium tellurium ($TeO_2$), and step (a-2) may be performed at a temperature in the range of 5° C. to 100° C., preferably in the range of 15° C. to 35° C., and more preferably in the range of 20° C. to 30°. When the temperature is lower than 5° C., it is not preferable because the chemical reaction rate is excessively low. When the temperature exceeds 100° C., it is not preferable because the crystallinity of the nanomaterial made of chalcogen element or chalcogenide which is a reaction product is not good so that the nanomaterial becomes polycrystalline or amorphous.

After step (a-2), step (a) may further include step (a-3) of subjecting the nanomaterial to a topotatic reaction to form an inorganic thermoelectric portion including the nanomaterial on the substrate.

The precursor aqueous solution may further include hydrofluoric acid (HF).

The substrate may include any one selected from the group consisting of a ceramic substrate, a metal substrate, and a polymer substrate. Preferably, the substrate includes a ceramic substrate and more preferably a silicon wafer.

Next, an organic conductor is formed between the nanomaterials to form an organic matrix including the organic conductor (step b).

After step (b), step (c) of removing the substrate from the organic matrix may be performed.

Mode for Carrying Out the Invention

EXAMPLE

Hereinafter, the present invention will be described in detail with reference to examples. However, the example is for illustrative purposes, and the scope of the present invention is not limited thereto.

Example 1: Preparation of Organic-Inorganic Composite Thermoelectric Material Including Aligned Se Nanowires Example 1-1

In a lid-attached container made of Teflon and containing distilled water as a solvent, selenium dioxide ($SeO_2$) was added to a concentration of 2 mM, and hydrogen fluoride (HF) was added to a concentration of 2.7 M, thereby obtaining a solution of 150 mL. In this case, the HF was completely mixed with the distilled water and stirred with a Teflon stirrer until $SeO_2$ was completely dissolved. A silicon wafer having a {100} single crystal plane having a size of 2 cm×2 cm was placed with Teflon tongs and seated on the bottom of the container containing the solution, and the lid of the container was closed to prevent evaporation of the solution during the reaction.

The container containing the solution and silicon wafer was put into a heater, and reaction was performed for 24 hours at a reaction temperature of 70° C. After the reaction was completed, the container was moved from the heater to be positioned under a hood, and the silicon wafer having which a plurality of Se nanowires aligned thereon was taken out of the container with Teflon tongs, washed three times sequentially using distilled water and ethanol, and dried at room temperature.

PEDOT:PSS as an organic conductor was applied between each of the aligned Se nanowires through spin coating and heated at 120° C. for 3 hours. To control the electrical conductivity of the PEDOT:PSS, 6% by volume of ethylene glycol (EG) was applied. Thereafter, the organic-inorganic composite thermoelectric portion including the aligned Se nanowires was prepared by removing the silicon wafer.

Example 1-2

An organic-inorganic composite thermoelectric material including Se nanowires that are aligned was prepared in the same manner as in Example 1-1, except that 8% by volume of an EG aqueous solution was used instead of 6% by volume EG aqueous solution in Example 1-1.

Example 1-3

An organic-inorganic composite thermoelectric material including Se nanowires that are aligned was prepared in the same manner as in Example 1-1, except that 10% by volume of an EG aqueous solution was used instead of 6% by volume EG aqueous solution that was used in Example 1-1.

Example 2: Preparation of Organic-Inorganic Composite Thermoelectric Material Including Aligned Te Nanowires Example 2-1

In a lid-attached container made of Teflon and containing distilled water as a solvent, tellurium dioxide ($TeO_2$) was added to a concentration of 2 mM, and hydrogen fluoride (HF) was added to a concentration of 4.5 M, thereby obtaining a solution of 150 mL. In this case, the HF was completely mixed with the distilled water and stirred with a Teflon stirrer until $TeO_2$ was completely dissolved. A silicon wafer having a {100} single crystal plane having a size of 2 cm×2 cm was placed with Teflon tongs and seated on the bottom of the container containing the solution, and the lid of the container was closed to prevent evaporation of the solution during the reaction.

The reaction was carried out at room temperature (25° C.) for 24 hours. After the reaction was completed, the container was moved to a hood, and the silicon wafer having a plurality of Te nanowires aligned thereon was taken out of the container with Teflon tongs, washed three times sequentially using distilled water and ethanol, and dried at room temperature.

PEDOT:PSS as an organic conductor was applied between each of the aligned Te nanowires through spin coating and heated at 120° C. for 3 hours. To control the electrical conductivity of the PEDOT:PSS, 6% by volume of ethylene glycol (EG) was applied. Thereafter, the organic-inorganic composite thermoelectric portion including the aligned Te nanowires was prepared by removing the silicon wafer.

Example 2-2

An organic-inorganic composite thermoelectric material including Te nanowires that are aligned was prepared in the same manner as in Example 2-1, except that 8% by volume of an EG aqueous solution was used instead of 6% by volume an EG aqueous solution used in Example 2-1.

Example 2-3

An organic-inorganic composite thermoelectric material including Te nanowires that are aligned was prepared in the same manner as in Example 2-1, except that 10% by volume of an EG aqueous solution was used instead of 6% by volume an EG aqueous solution used in Example 2-1.

Example 3: Preparation of Organic-Inorganic Composite Thermoelectric Material Including Aligned $Ag_2Te$ Nanowires Example 3-1

In a lid-attached container made of Teflon and containing distilled water as a solvent, tellurium dioxide ($TeO_2$) was added to a concentration of 2 mM, and hydrogen fluoride (HF) was added to a concentration of 4.5 M, thereby obtaining a solution of 150 mL. In this case, the HF was completely mixed with the distilled water and stirred with a Teflon stirrer until $TeO_2$ was completely dissolved. A silicon wafer having a {100} single crystal plane having a size of 2 cm×2 cm was placed with Teflon tongs and seated on the bottom of the container containing the solution, and the lid of the container was closed to prevent evaporation of the solution during the reaction.

The reaction was carried out at room temperature (25° C.) for 24 hours. After the reaction was completed, the container was moved to a hood, and the silicon wafer having a plurality of Te nanowires aligned thereon was taken out of the container with Teflon tongs, washed three times sequentially using distilled water and ethanol, and dried at room temperature.

The silicon wafer having the aligned plurality of Te nanowires aligned thereon was put into a 1M $AgNO_3$ solution prepared by adding 0.1 g $AgNO_3$ to 5 ml ethylene glycol, and reaction was carried out at room temperature for several minutes (1 to 60 minutes). This reaction is called "topotatic reaction" through which the Te nanowires were changed to $Ag_2Te$ nanowires.

PEDOT:PSS as an organic conductor was applied between each of the aligned Te nanowires through spin coating and heated at 120° C. for 3 hours. To control the electrical conductivity of the PEDOT:PSS, 6% by volume of an ethylene glycol (EG) aqueous solution was applied. Thereafter, the silicon wafer was removed and thus an organic-inorganic composite thermoelectric material including the aligned $Ag_2Te$ nanowires was obtained.

Example 3-2

An organic-inorganic composite thermoelectric material including $Ag_2Te$ nanowires that are aligned was prepared in the same manner as in Example 3-1, except that 8% by volume of an EG aqueous solution was used instead of 6% by volume an EG aqueous solution that was used in Example 3-1.

Example 3-3

An organic-inorganic composite thermoelectric material including $Ag_2Te$ nanowires that are aligned was prepared in the same manner as in Example 3-1, except that 10% by volume of an EG aqueous solution was used instead of 6% by volume an EG aqueous solution that was used in Example 3-1.

Comparative Example 1: Preparation of Organic-Inorganic Composite Thermoelectric Material Including Unaligned CNT An organic-inorganic composite thermoelectric material containing unaligned CNTs was obtained by in-situ polymerization of aniline for which ammonium peroxydisulfate (APS) was used as an oxidizing agent in the presence of multi-walled carbon nanotubes (AWNTs).

An aniline/MWNT/HCl suspension was prepared by mixing aniline monomers and MWNT and then adding the mixture to 1 M HCl. The APS/HCl solution was slowly dropped into the well stirred aniline/MWNT/HCl suspension. The polymerization reaction was carried out under stirring in an ice bath of 0° C. for 6 hours. The reaction product was filtered and washed 3 times with deionized water and then 3 times with ethanol. The product was then dried under vacuum. The product in a powder form was added to 50 ml of an 0.1 M ammonia solution, stirred at room temperature for 24 hours, filtered, washed three times with deionized water and then three times with ethanol, and then dried under vacuum. The obtained powder was a complex containing CNT and emeraldine-based polyaniline.

The organic-inorganic composite thermoelectric material contained unaligned CNTs was prepared by mixing the CNT-containing emeraldine-based polyaniline powder with camphorsulfonic acid (CSA) and doping the resulting mixture with polyaniline.

Comparative Example 2: Preparation of Organic-Inorganic Composite Thermoelectric Material Including Unaligned CNT First, 0.03 g rGO was dispersed in a PSS solution (10 mL, 17 mg mL$^{-1}$) under sonication for 30 minutes. Next, 0.1 g of 3,4-ethylenedioxythiophene (EDOT) was added and magnetically stirred for 15 minutes. Next, 0.25 g of ammonium peroxydisulfate (APS) was added and dissolved, and then 2 mL of FeCl$_3$ solution (30 mg mL$^{-1}$) was slowly dropped for about 30 minutes. The polymerization reaction was continued for 12 hours under continuous stirring at room temperature to prepare a mixed solution. The mixed solution was drop-casted on a glass substrate having a size of 7.5 cm×0.6 cm and dried on a hot plate at 60° C., thereby producing an organic-inorganic composite thermoelectric material including unaligned CNTs.

Comparative Example 3: Preparation of Organic-Inorganic Composite Thermoelectric Material Including Unaligned Te Nanowires A mixture was prepared by adding Te nanowires to a PEDOT:PSS solution, and the mixture was filtered to produce an organic-inorganic composite thermoelectric material containing unaligned Te nanowires.

Comparative Example 4: Preparation of Organic-Inorganic Composite Thermoelectric Material Including Unaligned Te Nanowires A mixture was prepared by adding Te nanowires to a PEDOT:PSS solution, and the mixture was dropped on a glass substrate, and heat-treated on a 120° C. hot plate to produce an organic-inorganic composite thermoelectric material containing unaligned Te nanowires.

Comparative Example 5: Preparation of Organic-Inorganic Composite Thermoelectric Material Containing Unaligned Bi$_2$Te$_3$ Nanoparticles A solution obtained by dispersing Bi$_2$Te$_3$ nanoparticles in alcohol was sprayed on a glass substrate and dried. Next, a PEDOT:PSS solution was sprinkled on the glass substrate and heat-treated on a hot plate at 120° C., thereby producing a composite thermoelectric material containing nonaligned Bi$_2$Te$_3$ nanoparticles.

Comparative Example 6: Preparation of Organic-Inorganic Composite Thermoelectric Material Including Graphene Layer After dispersing graphene in a PEDOT:PSS solution, a spin coating method was used to form a film. The film was heat-treated in an oven at 120° C. to prepare an organic-inorganic composite thermoelectric material containing unaligned graphene.

EXPERIMENTAL EXAMPLE

Experimental Example 1: Scanning Electron Microscope (SEM) Analysis

Figure 3:
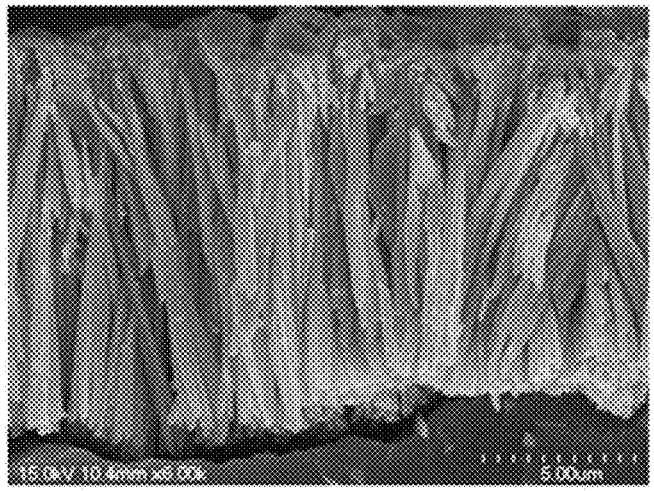
FIG. 3 is an SEM image of a plurality of aligned Se nanowires formed on a silicon wafer before an organic conductor (PEDOT:PSS) is spin coated in Example 1, the SEM image being taken in a vertical direction.
Figure 4:
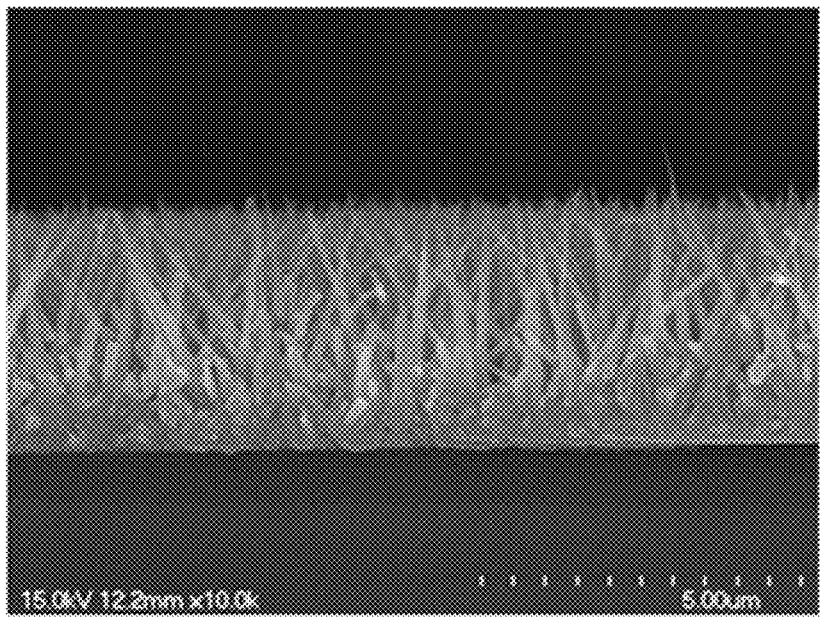
FIG. 4 is an SEM image of a plurality of aligned Te nanowires formed on a silicon wafer before an organic conductor (PEDOT:PSS) is spin coated in Example 2, the SEM image being taken in a vertical direction.

FIGS. 3 and 4 are SEM images taken in a vertical direction of an organic-inorganic composite thermoelectric material including aligned Se wires and an organic-inorganic composite thermoelectric material including aligned Te wires which were prepared according to Examples 1 and 2, respectively. Referring to FIGS. 3 and 4, it was confirmed that the nanomaterials were aligned in a direction perpendicular to the substrate.

Figure 5:
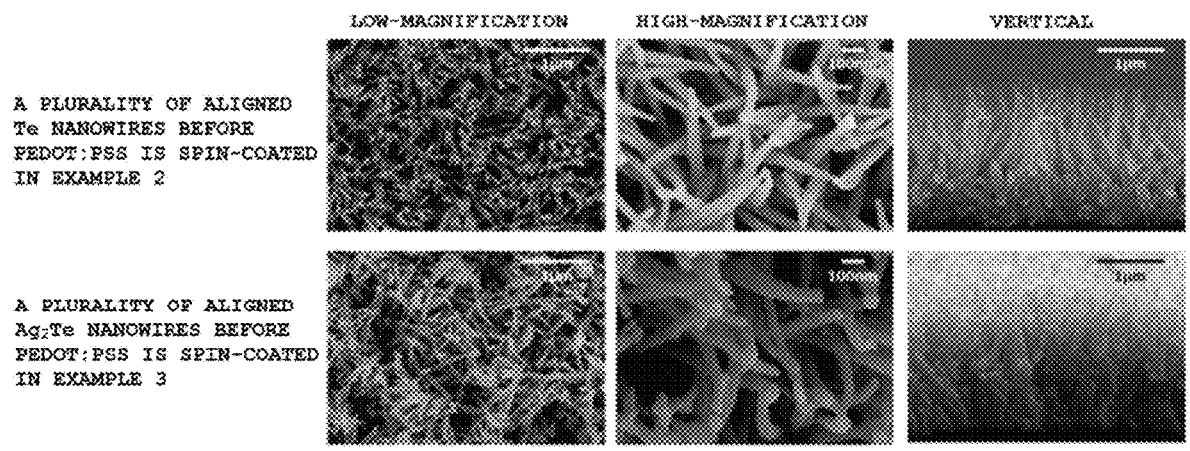
FIG. 5 includes a low-magnification image, a high-magnification FE-SEM image, and an image taken in a vertical direction, in which the images show a plurality of aligned Te nanowires famed on a silicon wafer before an organic conductor (PEDOT:PSS) is spin-coated in Example 2 and show a plurality of aligned $Ag_2Te$ nanowires formed on a silicon wafer before an organic conductor is spin-coated in Example 3 in which the Te nanowires are subjected to a topotatic reaction.

FIG. 5 includes low-magnification and high-magnification FE-SEM images of the organic-inorganic composite thermoelectric material prepared according to Examples 2 and 3 and includes an SEM image taken in a vertical direction. Referring to FIG. 5, Ag$_2$Te nanowires of Examples 3 were obtained by chemically transforming the Te nanowires of Example 2. It was confirmed from the SEM image that the Ag$_2$Te nanowires of Example 3 were aligned perpendicular to the substrate through the chemical transformation.

Experimental Example 2: Comparison of Seebeck Coefficient, Electrical Conductivity, and Power Factor Electrical properties and Seebeck coefficient were measured using a 4-point probe and a self-manufactured Seebeck measurement system. The Seebeck coefficient (S) was determined from a plot of the measured Seebeck voltages as a function of the temperature differences (<3° C.) across the sample (S=ΔV/ΔT). The sum of the Seebeck coefficient (S) and the electrical conductivity (σ) is the power factor (S$^2$(σ).

Figure 6:
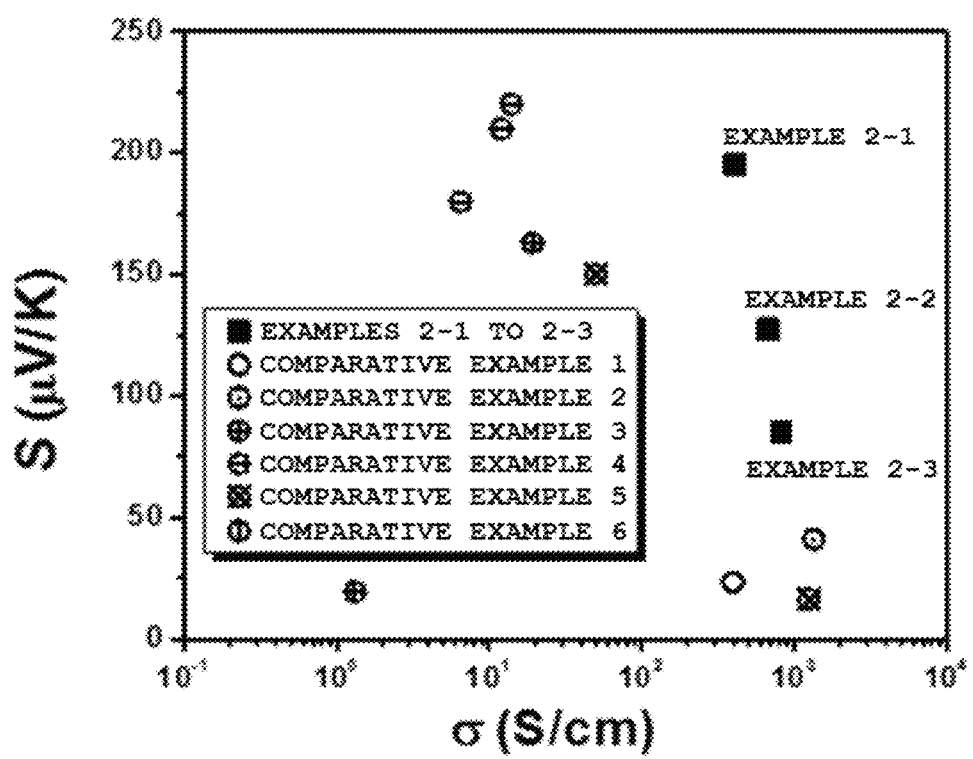
FIG. 6 is a graph showing the Seebeck coefficient and electrical conductivity of the organic-inorganic composite thermoelectric materials prepared according to Examples 2-1 to 2-3 and Comparative Examples 1 to 6.
Figure 7:
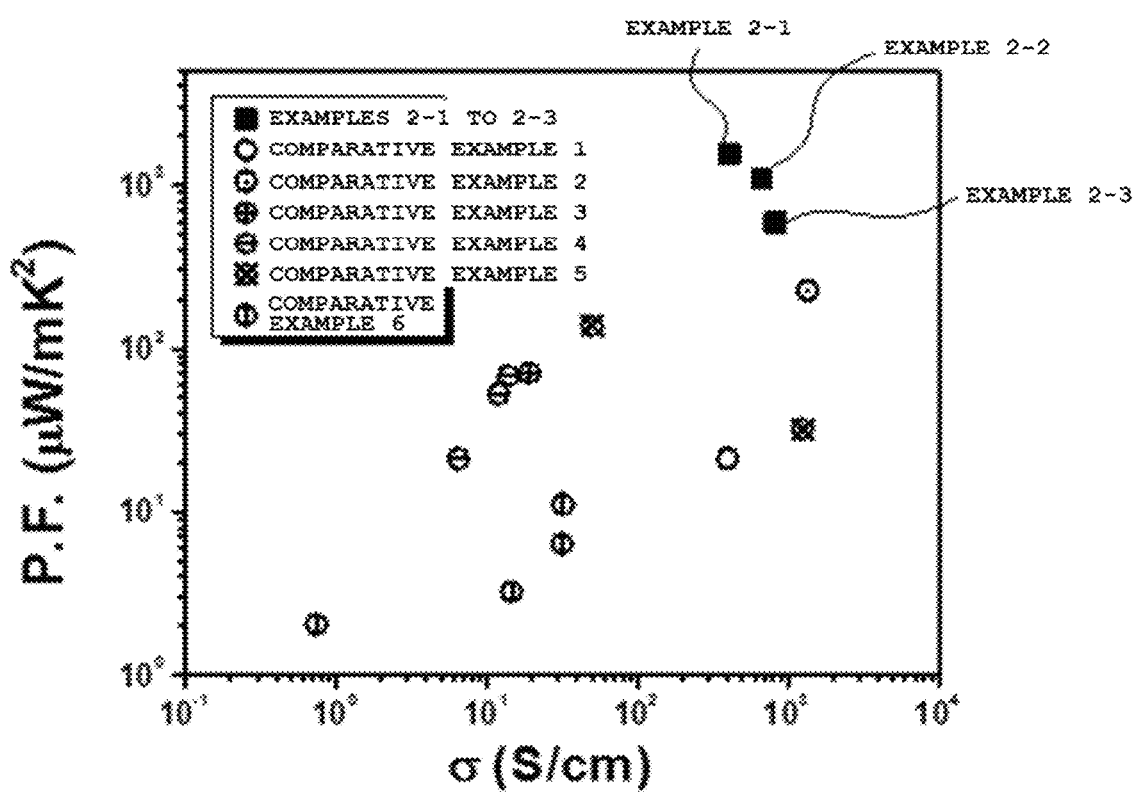
FIG. 7 is a graph showing the power factor and electrical conductivity of the organic/inorganic composite thermoelectric materials prepared according to Examples 2-1 to 2-3 and Comparative Examples 1 to 6.

FIG. 6 illustrate the Seebeck coefficient and electrical conductivity of the organic-inorganic composite thermoelectric materials prepared according to Examples 2-1 to 2-3 and Comparative Examples 1 to 6, and FIG. 7 illustrates the power factors and electrical conductivities.

Referring to FIGS. 6 and 7, the organic-inorganic composite thermoelectric materials having aligned Te nanowires prepared according to Examples 2-1 to 2-3 have high electrical conductivity exhibited by organic thermoelectric materials and high Seebeck coefficient exhibited by inorganic thermoelectric materials. It was also confirmed that the thermoelectric performances of the respective prepared materials were superior to that of unaligned composite thermoelectric materials.

It will be apparent to those skilled in the art that various modifications, additions, and removals of some parts of the present invention may be made without departing from the spirit of the invention as defined in the appended claims, and ones resulting from the modifications, additions, and removals of the parts also will fall into the scope of the present invention. For example, each component described as a single form may be implemented in a dispersed form, and likewise components described as being separated may also be implemented in a combined form. The scope of the present invention is defined by the following claims rather than the above detailed description, and all changes or modifications derived from the meaning and scope of the claims and their equivalent concepts should be interpreted as falling into the scope of the present invention.

INDUSTRIAL APPLICABILITY

The organic-inorganic composite thermoelectric material of the present invention has advantages of low cost and excellent thermoelectric properties due to the composite of an aligned inorganic thermoelectric material and an organic thermoelectric material.

The invention claimed is:

1. An organic-inorganic composite thermoelectric material comprising:
   an organic matrix comprising an organic conductor; and
   an inorganic thermoelectric portion dispersed in the organic matrix and comprising nanomaterials having at least one selected from the group consisting of a chalcogen element and a chalcogenide,
   wherein,
   the organic-inorganic composite thermoelectric material further comprises a substrate,
   the nanomaterials are spaced from each other and aligned in parallel with each other and perpendicular to a surface of the substrate, and
   the nanomaterials have a shape of a nanowire.

2. The organic-inorganic composite thermoelectric material of claim 1, wherein the nanomaterials are the chalcogen element comprising at least one selected from the group consisting of sulfur(S), selenium (Se), and polonium (Po).

3. The organic-inorganic composite thermoelectric material of claim 1, the chalcogenide is a compound comprising a chalcogen element.

4. The organic-inorganic composite thermoelectric material of claim 1, wherein the chalcogenide comprises at least one selected from the group consisting of $Ag_2Te$, $CdS$, $PbTeSe$, $Bi_2Se_3$, $Sb_2Se_3$, $PbSe$, $CdSe$, $ZnSe$, $La_3Se_4$, $Ag_xSb_{1-x}Se_2$ (x is a real number less than 1), $AgPb_{18}BiSe_{20}$, $(GeSe)_x(AgSbSe_2)_{1-x}$ (x is a real number less than 1), $Ag_xPb_{18}SbSe_{20}$ (x is a real number less than 1), $Ag_xPb_{22.5}SbSe_{20}$ (x is a real number less than 1), $Sb_xSe_{20}$ (x is a real number less than 1), $Sn_xSe_{1-x}$ (x is a real number less than 1), $Ge_xSe_{1-x}$ (x is a real number less than 1), $Ge_xSb_{1-x}Se$ (x is a real number less than 1), $Bi_2Te_3$, $Sb_2Te_3$, $PbTe$, $CdTe$, $ZnTe$, $La_3Te_4$, $Ag_xSb_{1-x}Te_2$ (x is a real number less than 1), $AgPb_{18}TeTe_{20}$, $(GeTe)_x(AgSbTe_2)_{1-x}$ (x is a real number less than 1), $Ag_xPb_{18}SbTe_{20}$ (x is a real number less than 1), $Ag_xPb_{22.5}SbTe_{20}$ (x is a real number less than 1), $Sb_xTe_{20}$ (x is a real number less than 1), $Bi_xSb_{2-x}Te_3$ (x is a real number less than 2), $Sn_xTe_{1-x}$ (x is a real number less than 1), $Ge_xTe_{1-x}$ (x is a real number less than 1), and $Ge_xSb_{1-x}Te$ (x is a real number less than 1).

5. The organic-inorganic composite thermoelectric material of claim 1, wherein the organic conductor comprises at least one selected from the group consisting of poly(3,4-ethylene dioxythiophene):polystyrene sulfonate (PEDOT:PSS), polyacetylene, polypyrrole, polythiophene, and polyaniline.

* * * * *